US006222398B1

(12) United States Patent
Kondo

(10) Patent No.: US 6,222,398 B1
(45) Date of Patent: Apr. 24, 2001

(54) VOLTAGE DETECTING CIRCUIT

(75) Inventor: Chiaki Kondo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/444,906

(22) Filed: Nov. 22, 1999

(30) Foreign Application Priority Data

Nov. 20, 1998 (JP) .................................................. 10-331792

(51) Int. Cl.⁷ ...................................................... H03L 7/00
(52) U.S. Cl. ........................... 327/143; 327/198; 327/74; 327/76; 365/227
(58) Field of Search .................................... 327/142, 143, 327/198, 74, 75, 76, 77, 78, 79, 80; 365/226, 227, 228, 229

(56) References Cited

U.S. PATENT DOCUMENTS

| 4,031,463 | * | 6/1977 | Norgerg | ............................. 324/77 A |
| 5,541,551 | | 7/1996 | Brehner et al. | ....................... 327/539 |
| 5,642,063 | * | 6/1997 | Lehikoinen | ............................. 327/74 |
| 5,786,717 | * | 7/1998 | Yu | ......................................... 327/143 |

FOREIGN PATENT DOCUMENTS

| 2-48720 | 2/1990 | (JP) . |
| 4-295771 | 10/1992 | (JP) . |
| 10-198466 | 7/1998 | (JP) . |

OTHER PUBLICATIONS

Patent Abstracts of Japan, vol. 013, No. 333 (E–794), Jul. 26, 1989 & JP 01 097133 A (Mitsubishi Electric Corp), Apr. 14, 1989, *abstract*.

Patent Abstracts of Japan, vol. 010, No. 072 (P–438), Mar. 22, 1986 & JP 60–221370 A (Toshiba KK), Oct. 23, 1985, *abstract*.

Patent Abstracts of Japan, vol. 1996, No. 04, Apr. 30, 1996 & JP 07 0322682 A (Mitsubishi Electric Corp), Dec. 8. 1995, *abstract*.

Japanese Office Action issued Aug. 1, 2000 in a related application and English translation of relevant portions.

* cited by examiner

Primary Examiner—Timothy P. Callahan
Assistant Examiner—An T. Luu
(74) Attorney, Agent, or Firm—Ostrolenk, Faber, Gerb & Soffen, LLP

(57) ABSTRACT

The present invention provides a voltage detecting circuit comprising: at least a low voltage detecting circuit for detecting that a power voltage is lower than at least a predetermined reference voltage; at least a high voltage detecting circuit for detecting that the power voltage is higher than the at least a predetermined reference voltage; and a controller being connected to the at least a low voltage detecting circuit and the at least a high voltage detecting circuit for detecting that the power voltage is higher than the at least a predetermined reference voltage; and a controller being connected to the at least a low voltage detecting circuit and the at least a high voltage detecting circuit so that the controller receives an output signal from the at least a high voltage detecting circuit in order to place the at least a low voltage detecting circuit into selected one of operable and inoperable states in accordance with the output signal from the at least a high voltage detecting circuit.

7 Claims, 2 Drawing Sheets

VOLTAGE DETECTING CIRCUIT

BACKGROUND OF THE INVENTION

The present invention relates to a voltage detecting circuit, and more particularly to a voltage detecting circuit suitable to be accommodated in various electronic circuit devices such as a single chip microcomputer, semiconductor memories such as read only memory and random access memory, and a digital signal processor.

In prior art, a low voltage detecting circuit is accommodated in a single chip microcomputer for detecting that a power voltage level is dropped into a lower voltage level than a predetermined reference voltage level. Almost all circuit configurations of the microcomputer are designed to be common in voltage level but only a power voltage is different in voltage level from the other circuit configurations. For example, the reference voltage is set at 4V and the power voltage level is set at 5V. The voltage detecting circuit may be designed to detect that the power voltage level is dropped to a lower voltage level than 4V of the reference voltage level. This voltage detecting circuit for detecting the lower voltage level than 4V is, however, inapplicable to a microcomputer operable in a lower power voltage of 3V because this voltage detecting circuit always detects the lower voltage level than 4V even the power voltage is normal at 3V. Once the voltage detecting circuit detects the lower voltage level than 4V, CPU CORE performs re-set process to prevent malfunction, whereby any other circuits in this microcomputer are also made inoperable by the re-set process.

In order to prevent this problem, the following two measures have been proposed.

The first measure is to set selectable two mask options. The first option is to place the low voltage detecting circuit into an operable state in accordance with the power voltage of the microcomputer. The second option is to set the low voltage detecting circuit into an inoperable state normally. If the above voltage detecting circuit for detecting the lower voltage level than 4V is applicable to the microcomputer operable with the power voltage of 5V, the voltage detecting circuit is set via the mask option to be operable state normally. If, however, the above voltage detecting circuit for detecting the lower voltage level than 4V is applicable to the microcomputer operable with the power voltage of 3V, the voltage detecting circuit is set via the mask option to be inoperable state normally.

The second measure is to set the low voltage detecting circuit to be inoperable state when the microcomputer is manufactured, so that in use of the microcomputer, CPU CORE sends an instruction to enable or unable operations of the lower voltage detecting circuit in accordance with the power voltage level. If the above voltage detecting circuit for detecting the lower voltage level than 4V is applicable to the microcomputer operable with the power voltage of 5V, CPU CORE sends the instruction to enable the low voltage detecting circuit to operate normally whereby the low voltage detecting circuit is placed into the operable state. If, however, the above voltage detecting circuit for detecting the lower voltage level than 4V is applicable to the microcomputer operable with the power voltage of 3V, CPU CORE sends the opposite instruction to unable the low voltage detecting circuit to not operate normally whereby the low voltage detecting circuit is placed into the inoperable state.

The above described first and second measures have the following problems respectively.

The problem with the first measure is inapplicable to other type microcomputer which is incapable of designating mask option. For example, a mask programmable ROM type microcomputer is capable of designating the above mask options. The above first measure is applicable to this microcomputer capable of designating the above mask options. RPROM type microcomputers allowing users to write programs in use into the RPROM are, however, incapable designating the above mask options. The above first measure is thus inapplicable to this microcomputer incapable of designating the above mask options.

The problem with the second measure is that it is difficult to make the programs common because CPU CORE sends the instruction to enable or unable the low voltage detecting circuit to operate in accordance with the power voltage level of the microcomputer whereby the program is required to be changed in accordance with the power voltage level.

In the above circumstances, it had been required to develop a novel voltage detecting circuit free from the above problem.

SUMMARY OF THE INVENTION

Accordingly, it is an object of the present invention to provide a novel voltage detecting circuit free from the above problems.

It is a further object of the present invention to provide a novel voltage detecting circuit capable of controlling operations of the voltage detecting circuit in accordance with a set power voltage level even after a microcomputer accommodating the voltage detecting circuit has been manufactured, in order to allow the use of common programs.

It is a still further object of the present invention to provide a novel voltage detecting circuit applicable to various types of microcomputers including a microcomputer incapable of designating a mask option such as EPROM type microcomputer and various types of semiconductor memories and electronic circuits.

It is yet a further object of the present invention to provide a novel voltage detecting circuit applicable to microcomputers and electronic devices which use different power voltage levels.

The present invention provides a voltage detecting circuit comprising: at least a low voltage detecting circuit for detecting that a power voltage is lower than at least a predetermined reference voltage; at least a high voltage detecting circuit for detecting that the power voltage is higher than the at least a predetermined reference voltage; and a controller being connected to the at least a low voltage detecting circuit and the at least a high voltage detecting circuit so that the controller receives an output signal from the at least a high voltage detecting circuit in order to place the at least a low voltage detecting circuit into selected one of operable and inoperable states in accordance with the output signal from the at least a high voltage detecting circuit.

The above and other objects, features and advantages of the present invention will be apparent from the following descriptions.

BRIEF DESCRIPTION OF THE DRAWINGS

Preferred embodiments according to the present will be described in detail with reference to the accompanying drawings.

DISCLOSURE OF THE INVENTION

Figure 1:
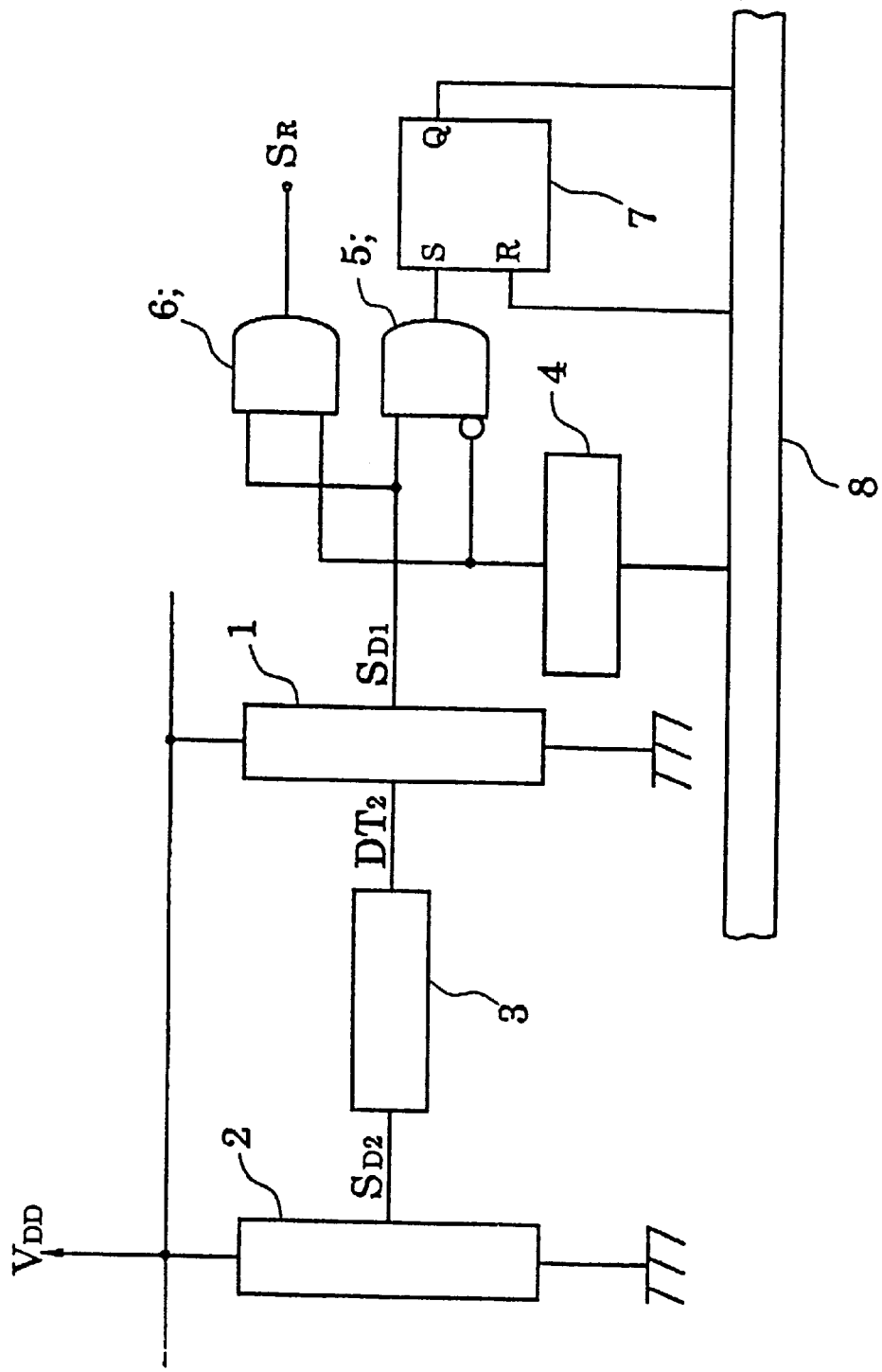
FIG. 1 is a block diagram illustrative of a circuit configuration of a first novel voltage detecting circuit in a first embodiment in accordance with the present invention.

The present invention provides a voltage detecting circuit comprising: at least a low voltage detecting circuit for detecting that a power voltage is lower than at least a predetermined reference voltage; at least a high voltage detecting circuit for detecting that the power voltage is higher than the at least a predetermined reference voltage; and a controller being connected to the at least a low voltage detecting circuit and the at least a high voltage detecting circuit so that the controller receives an output signal from the at least a high voltage detecting circuit in order to place the at least a low voltage detecting circuit into selected one of operable and inoperable states in accordance with the output signal from the at least a high voltage detecting circuit.

It is preferable that first and second low voltage detecting circuits are provided for detecting that a power voltage is lower than a first predetermined reference voltage and that a power voltage is lower than a second predetermined reference voltage, respectively.

It is also preferable to further comprise a logic circuit connected to the at least a low voltage detecting circuit for receiving a low voltage detecting signal from the at least at least a low voltage detecting circuit to generate a reset signal in accordance with the low voltage detecting signal.

It is also preferable to further comprise a logic circuit connected to the at least at least a low voltage detecting circuit for receiving a low voltage detecting signal from the at least at least a low voltage detecting circuit to generate an interrupting request signal in accordance with the low voltage detecting signal.

It is also preferable to further comprise a flag connected to the at least at least a low voltage detecting circuit for receiving a low voltage detecting signal from the at least at least a low voltage detecting circuit to set the flag in accordance with the low voltage detecting signal.

It is also preferable to further comprise: a logic circuit connected to the at least at least a low voltage detecting circuit for receiving a low voltage detecting signal from the at least at least low voltage detecting circuit to generate a reset signal in accordance with the low voltage detecting signal; a flag connected to the at least at least a low voltage detecting circuit for receiving a low voltage detecting signal from the at least at least a low voltage detecting circuit to set the flag in accordance with the low voltage detecting signal, wherein any one use of the logic circuit and the flag is selectable by an instruction from CPU.

It is preferable to further comprise: a logic circuit connected to the at least at least a low voltage detecting circuit for receiving a low voltage detecting signal from the at least at least a low voltage detecting circuit to generate an interrupting request signal in accordance with the low voltage detecting signal; a flag connected to the at least at least a low voltage detecting circuit for receiving a low voltage detecting signal from the at least at least a low voltage detecting circuit to set the flag in accordance with the low voltage detecting signal, wherein any one use of the logic circuit and the flag is selectable by an instruction from CPU.

The above novel voltage detecting circuit is capable of controlling operations of the voltage detecting circuit in accordance with a set power voltage level even after a microcomputer accommodating the voltage detecting circuit has been manufactured, in order to allow the use of common programs.

The above novel voltage detecting circuit is applicable to various types of microcomputers including a microcomputer incapable of designating a mask option such as EPROM type microcomputer and various types of semiconductor memories and electronic circuits.

The above novel voltage detecting circuit is also applicable to microcomputers and electronic devices which use different power voltage levels.

PREFERRED EMBODIMENT

First Embodiment

A first embodiment according to the present invention will be described in detail with reference to the drawings. FIG. 1 is a block diagram illustrative of a circuit configuration of a first novel voltage detecting circuit in a first embodiment in accordance with the present invention.

The first novel voltage detecting circuit is accommodated in a single chip microcomputer. The first novel voltage detecting circuit comprises a low voltage detecting circuit 1, a high voltage detecting circuit 2, a latch circuit 3, a resistor 4, a logic gate 5, an AND gate 6, a flag 7, and an internal data bus 8.

The low voltage detecting circuit 1 is connected between a high voltage line for supplying a power voltage Vdd and a ground line for supplying a ground potential. The high voltage detecting circuit 2 is also connected between the high voltage line for supplying the power voltage Vdd and the ground line for supplying the ground potential. The latch circuit 3 has an input terminal which is connected to an output terminal of the high voltage detecting circuit 2. The latch circuit 3 has an output terminal which is connected to an input terminal of the low voltage detecting circuit 1. The low voltage detecting circuit 1 is provided for detecting that the power voltage Vdd is dropped to a lower voltage level than a first reference voltage level Vref1 which has been predetermined. If the low voltage detecting circuit 1 detects that the power voltage Vdd is dropped to a lower voltage level than the first reference voltage level Vref1, then the low voltage detecting circuit 1 is operated to output a high level output signal as a first detection signal SD1. The high voltage detecting circuit 2 is provided for detecting that the power voltage Vdd is dropped to a voltage level lower than a second reference voltage level Vref2 which has been predetermined but higher than the first reference voltage level Vref1. This second reference voltage level Vref2 is higher than the first reference voltage level Vref1. If the high voltage detecting circuit 2 detects that the power voltage Vdd is dropped to a voltage level lower than the second reference voltage level Vref2 but higher than the first reference voltage level Vref1, then the high voltage detecting circuit 2 is operated to output a high level output signal as a second detection signal SD2.

The latch circuit 3 receives the second detecting signal SD2 from the high voltage detecting circuit 2 for temporary storing or latching the same and subsequent outputting data DT2. The latch circuit 3 continues to latch the second detecting data SD2 once the second detecting data SD2 becomes high level. The low voltage detecting circuit 1 receives the data DT2 from the latch circuit 3. If the low voltage detecting circuit 1 receives the data DT2 in high level, then the low voltage detecting circuit 1 is placed into an operable state. If, however, the low voltage detecting circuit 1 receives the data DT2 in low level, then the low voltage detecting circuit 1 is placed into an inoperable state. The low voltage detecting circuit 1 is operated to output a first detecting signal SD1.

The resister 4 has an input terminal which is connected to the internal data bus 8. The internal data bus 8 is provided for transmitting any interactions from the CPU core which is not illustrated. The resister 4 receives any instructions transmitted via the internal data bus 8 for setting its stored content to be either high level "H" or low level "L" in accordance with the received instruction.

The logic gate 5 has first and second input terminals. The first input terminal of the logic gate 5 is connected to an output terminal of the low voltage detecting circuit 1 for receiving the first detecting signal SD1 from the low voltage detecting circuit 1. The second input terminal of the logic gate 5 is connected to an output terminal of the resistor 4 for receiving an inverted signal to the output signal of either high level "H" or low level "L" from the resister 4. The logic gate 5 performs AND operation of the first detecting signal SD1 and the inverted signal. The logic gate 5 outputs and output signal as a result of the AND operation.

The AND gate 6 has first and second input terminals. The first input terminal of the AND gate 6 is also connected to an output terminal of the low voltage detecting circuit 1 for receiving the first detecting signal SD1 from the low voltage detecting circuit 1. The second input terminal of the AND gate 6 is also connected to the output terminal of the resistor 4 for receiving a non-inverted signal to the output signal of either high "H" or low level "L" from the resister 4. The AND gate 6 performs AND operation of the first detecting signal SD1 and the non-inverted signal. The AND gate 6 outputs an internal reset signal SR as a result of the AND operation.

The flag 7 comprises a flip flop circuit of set/reset type. The flag 7 has two input terminals "S" and "R" and a single output terminal "O". The first input terminal "S" of the flag 7 is connected to the output terminal of the logic gate 5 for receiving the output signal from the logic gate 5. If the first input terminal "S" of the flag 7 receives a high level signal "H" from the logic gate 5, then the flag 7 is set to enter into a high level "H". The second input terminal "R" of the flag 7 is connected to the internal data bus 8 for receiving the instruction from the CPU core so that the flag 7 is reset to enter into a low level "L". The single output terminal "Q" of the flag 7 is connected to the internal data bus 8 so as to allow the content of the flag 7 to be read out in accordance with a read out instruction which has been transmitted via the internal data bus from the CPU core.

The following descriptions will focus on operations of the above first novel voltage detecting circuit in the first embodiment in accordance with the present invention. Operational modes of the first novel voltage detecting circuit may be classified into first and second modes. In the first mode, the initial power voltage level VDDB is set to be higher than the second reference voltage level Vref2. In the second mode, the initial power voltage level VDDB is set to be lower than the second reference voltage level Vref2.

First Mode

First Initial State

The operation in the first mode of the first novel voltage detecting circuit placed in a first initial state will be described. In the initial state, the data DT2 from the latch circuit 3 are set to be low level "L", and thus the low voltage detecting circuit 1 is in the inoperable state. The flag 7 has been reset to be the low level "L" in accordance with the instruction which has been transmitted via the internal data bus 8 from the CPU core. The content stored in the resister 4 is set to be the low level "L".

The initial power voltage level VDD is set to be higher than the second reference voltage level Vref2, whereby the high voltage detecting circuit 2 detects that the power voltage level is higher than the second reference voltage level Vref2. The high voltage detecting circuit 2 outputs a low level output signal as the second detection signal SD2. Prior to this detection by the high voltage detecting circuit 2, however, the second detection signal SD2 was the high level, for which reason the latch circuit 3 latches the high level as the second detection signal SD2 to continue outputting the high level data as the output data DT2 even the high voltage detecting circuit 2 currently outputs a low level output signal as the second detection signal SD2. The low voltage detecting circuit 1 is kept to receive the high level data DT2 from the latch circuit 3 even after the high voltage detecting circuit 2 has detected that the power voltage level has become higher than the second reference voltage level Vref2.

If the power voltage level VDD is further dropped to a lower voltage level than the first reference voltage level Vref1, then the low voltage detecting circuit 1 detects that the power voltage level VDD is lower than the first reference voltage level Vref1. The low voltage detecting circuit 1 outputs the first detection signal SD1 of the high level "H". The first detection signal SD1 of the high level "H" is then transmitted through the logic gate 5 to the flag 7 so that the flag 7 is set to be the high level "H". The CPU core sends a read out instruction through the internal data bus 8 to the flag 7, whereby the high level "H" of the flag 7 is red out. Accordingly, the drop of the power voltage VDD down to the first reference voltage level Vref1 can be recognized by the CPU core. The CPU core therefore perform the necessary processing such as reset operations for preventing malfunction of the microcomputer.

Meanwhile, the content stored in the resister 4 has been set to be the low level "L" in the initial state, for which reason the first detection signal SD1 of he high level "H" does not pass through the AND gate 6, whereby the internal reset signal SR remains low level "L".

Second Initial State

The operation in the first mode of the first novel voltage detecting circuit placed in a second initial state will be described. In the initial state, the date DT2 from the latch circuit 3 are set to be low level "L", and thus the low voltage detecting circuit 1 is in the inoperable state. The flag 7 has been reset to be the low level "L" in accordance with the instruction which has been transmitted via the internal data bus 8 from the CPU core. The content stored in the resister 4 is set to be the high level "H".

The initial power voltage level VDD is set to be higher than the second reference voltage level Vref2, whereby the high voltage detecting circuit 2 detects that the power voltage level is higher than the second reference voltage level Vref2. The high voltage detecting circuit 2 outputs a low level output signal as the second detection signal SD2. Prior to this detection by the high voltage detecting circuit 2, however, the second detection signal SD2 was the high level, for which reason the latch circuit 3 latches the high level as the second detection signal SD2 to continue outputting the high level data as the output data DT2 even the high voltage detecting circuit 2 currently outputs a low level output signal as the second detection signal SD2. The low voltage detecting circuit 1 is kept to receive the high level data DT2 from the latch circuit 3 even after the high voltage detecting circuit 2 has detected that the power voltage level has become higher than the second reference voltage level Vref2.

If the power voltage level VDD is further dropped to a lower voltage level than the first reference voltage level Vref1, then the low voltage detecting circuit 1 detects that the power voltage level VDD is lower than the first reference voltage level Vref1. The low voltage detecting circuit 1 outputs the first detection signal SD1 of the high level "H". The first detection signal SD1 of the high level "H" is then transmitted through the AND gate 6 whereby the internal reset signal SR of the high level "H" is outputted from the AND gate 6. The CPU core and other internal circuits in the microcomputer can recognize that the power voltage level VDD is lower than the first reference voltage level Vref1 in accordance with the internal reset signal SR of the high level "H". The CPU core therefore perform the necessary processing such as reset operations for preventing malfunction of the microcomputer.

Meanwhile, the content stored in the resister 4 has been set to be the high level "H" in the initial state, for which reason the first detection signal SD1 of he high level "H" does not pass through the logic gate 5, whereby the flag 7 remains low level "L".

Second Mode

The operation in the second mode of the first novel voltage detecting circuit will be described. In the initial state, the data DT2 from the latch circuit 3 are set to be low level "L", and thus the low voltage detecting circuit 1 is in the inoperable state. The flag 7 has been reset to be the low level "L" in accordance with the instruction which has been transmitted via the internal data bus 8 from the CPU core.

The initial power voltage level VDDB is set to be lower than the second reference voltage level Vref2, whereby the high voltage detecting circuit 2 detects that the power voltage level is lower than the second reference voltage level Vref2. The high voltage detecting circuit 2 continues to output a low level output signal as the second detection signal SD2. The latch circuit 3 keeps the initial state to continue to output low level data DT2. The low voltage detecting circuit 1 continues to receive the low level data DT2 from the latch circuit 3, whereby the low voltage detecting circuit 1 is kept in the inoperable state.

Even after the power voltage level VDD has been further dropped to a lower voltage level than the first reference voltage level Vref1, then the low voltage detecting circuit 1 is kept in the inoperable state, for which reason the low voltage detecting circuit 1 does not detect that the power voltage level VDD is lower than the first reference voltage level Vref1.

Independently from the contents stored in the resister 4, the flag 7 is kept reset in the low level "L" whilst the internal reset signal SR is also kept to be low level "L". The CPU core and the other internal circuits in the microcomputer does not recognizes the drop of the power voltage, whereby no reset operation is executed to allow the other circuits in the microcomputer to continue the normal operations.

Consequently, if the initial power voltage level is set to be higher than the second reference voltage level, then the low voltage detecting circuit is operable. If, however, the initial power voltage level is set to be lower than the second reference voltage level, then the low voltage detecting circuit is inoperable. Namely, setting the initial power voltage level with reference to the second reference voltage level can control the low voltage detecting circuit to be operable or inoperable state even after the microcomputer has been manufactured. The above first novel voltage detecting circuit is applicable to not only the microcomputer such as the mask programmable ROM type microcomputer capable of designating the mask option but also other microcomputer such as the EPROM type microcomputer incapable of designating the mask option.

The above first novel voltage detecting circuit makes it possible to set the low voltage detecting circuit to be operable or inoperable state without using any program, whereby programs may be made common even in the microcomputer using different power voltages.

Figure 2:
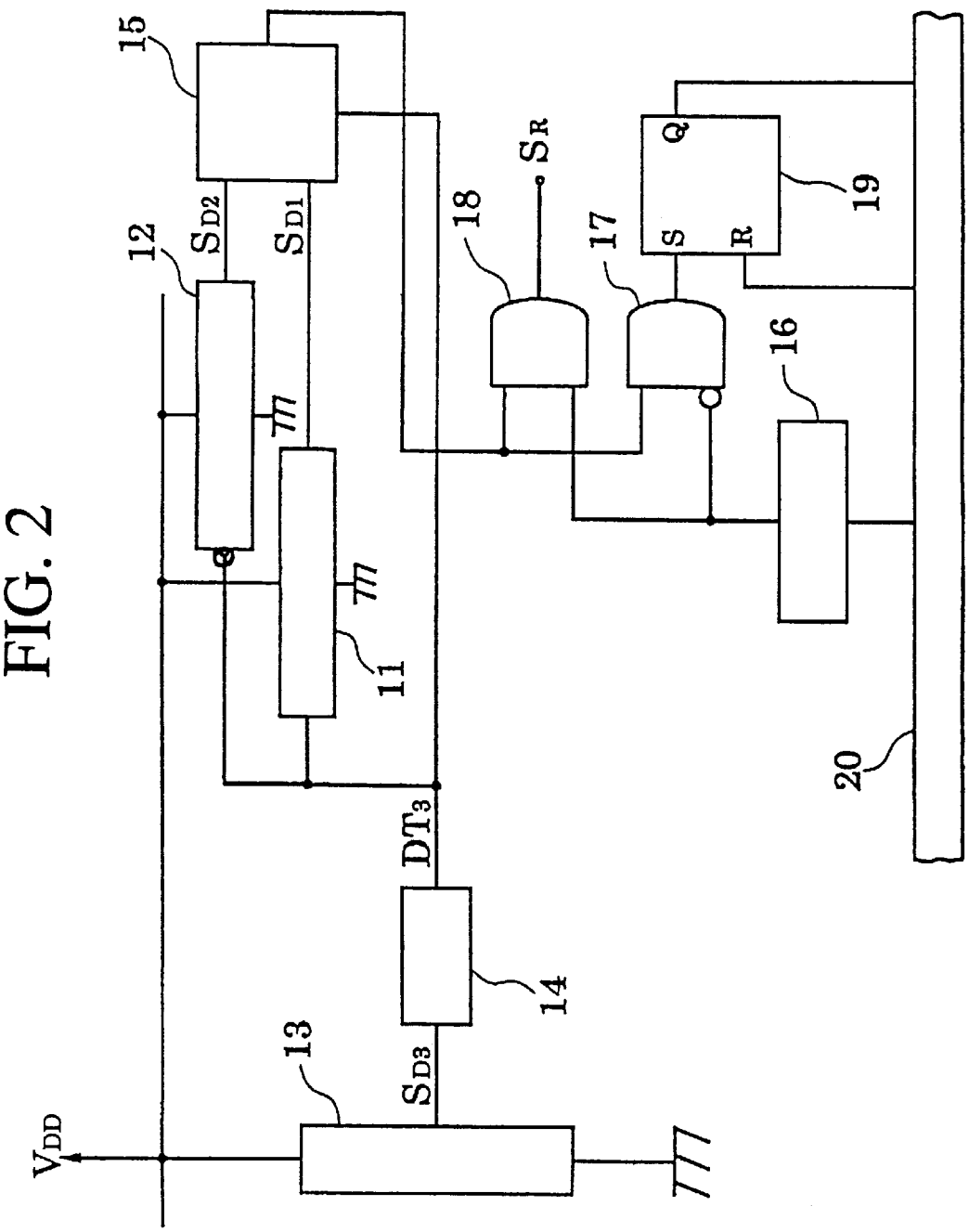
FIG. 2 is a block diagram illustrative of a circuit configuration of a second novel voltage detecting circuit in a second embodiment in accordance with the present invention.

A second embodiment according to the present invention will be described in detail with reference to the drawings. FIG. 2 is a block diagram illustrative of a circuit configuration of a second novel voltage detecting circuit in a second embodiment in accordance with the present invention.

The second novel voltage detecting circuit is accommodated in a single chip microcomputer. The second novel voltage detecting circuit comprises a first low voltage detecting circuit 11, a second low voltage detecting circuit 12, a high voltage detecting circuit 13, a latch circuit 14, a selector 15, a resistor 16, a logic gate 17, an AND gate 18, a flag 19, and an internal data bus 20.

The first low voltage detecting circuit 11 is connected between a high voltage line for supplying a power voltage Vdd and a ground line for supplying a ground potential. The second low voltage detecting circuit 11 is also connected between a high voltage line for supplying a power voltage Vdd and a ground line for supplying a ground potential. The high voltage detecting circuit 13 is also connected between the high voltage line for supplying the power voltage Vdd and the ground line for supplying the ground potential. The latch circuit 14 has an input terminal which is connected to an output terminal of the high voltage detecting circuit 13. The latch circuit 14 has an output terminal which is connected to an input terminal of the first low voltage detecting circuit 11 and also connected to an input terminal of the second low voltage detecting circuit 12. The first low voltage detecting circuit 11 is provided for detecting that the power voltage Vdd is dropped to a lower voltage level than a first reference voltage level Vref1 which has been predetermined. If the first low voltage detecting circuit 11 detects that the power voltage Vdd is dropped to a lower voltage level than the first reference voltage level Vref1, then the first low voltage detecting circuit 11 is operated to output a high level output signal as a first detection signal SD1. The second low voltage detecting circuit 12 is provided for detecting that the power voltage Vdd is dropped to a lower voltage level than a second reference voltage level Vref2 which has been predetermined, wherein the second reference voltage level Vref2 is lower than the first reference voltage level Vref1. If the second low voltage detecting circuit 12 detects that the power voltage Vdd is dropped to a lower voltage level than the second reference voltage level Vref2, then the second low voltage detecting circuit 12 is operated to output a high level output signal as a second detection signal SD2. The high voltage detecting circuit 13 is provided for detecting that the power voltage Vdd is higher than a third reference voltage level Vref3 which has been predetermined but higher than the first reference voltage level Vref1. This third reference voltage level Vref3 is higher than the first reference voltage level Vref1. If the high voltage detecting circuit 13 detects that the power voltage Vdd is higher than the third reference voltage level Vref3, then the high voltage detecting circuit 13 is operated to output a high level output signal as a third detection signal SD3.

The latch circuit 14 receives the third detecting signal SD3 from the high voltage detecting circuit 13 for temporary storing or latching the same and subsequent outputting data DT3. The latch circuit 14 continues to latch the third detecting data SD3 once the third detecting data SD3 become high level. The first low voltage detecting circuit 11 receives the data DT3 from the latch circuit 14. If the first low voltage detecting circuit 11 receives the data DT3 in high level, then the first low voltage detecting circuit 11 is placed into an operable state. If, however, the first low voltage detecting circuit 11 receives the data DT3 in low level, then the first low voltage detecting circuit 11 is placed into an inoperable state. The first low voltage detecting circuit 11 is operated to output a first detecting signal SD1. The second low voltage detecting circuit 12 receives an inverted signal to the data DT3 from the latch circuit 14. If the second low voltage detecting circuit 12 receives the data DT3 in high level, then the second low voltage detecting circuit 12 is placed into an inoperable state. If, however, the second low voltage detecting circuit 12 receives the data DT3 in low level, then the second low voltage detecting circuit 12 is placed into an operable state. The second low voltage detecting circuit 12 is operated to output a second detecting signal SD2.

The selector 15 has first and second input terminals, a control terminal and an output terminal. The first terminal of the selector 15 is connected to the output terminal of the first low voltage detecting circuit 11 for receiving the first detecting signal SD1 from the first low voltage detecting circuit 11. The second terminal of the selector 15 is connected to the output terminal of the second low voltage detecting circuit 12 for receiving the second detecting signal SD2 from the second low voltage detecting circuit 12. The control terminal of the selector 15 is connected to the output terminal of the latch circuit 14 for receiving the data DT3 from the latch circuit 14. Upon receipt of the data DT3 in the high level through the control terminal of the selector 15 from the latch circuit 14, the selector 15 selects the first detecting signal SD1 to output the same from the output terminal thereof. Upon receipt of the data DT3 in the low level through the control terminal of the selector 15 from the latch circuit 14, the selector 15 selects the second detecting signal SD2 to output the same from the output terminal thereof.

The resister 16 has an input terminal which is connected to the internal data bus 20. The internal data bus 20 is provided for transmitting any interactions from the CPU core which is not illustrated. The resister 16 receives any instructions transmitted via the internal data bus 20 for setting its stored content to be either high level "H" or low level "L" in accordance with the received instruction.

The logic gate 17 has first and second input terminals. The first input terminal of the logic gate 17 is connected to an output terminal of the selector 15 for receiving selected one of the first and second detecting signals SD1 and SD2 from the selector 15. The second input terminal of the logic gate 17 is connected to an output terminal of the resistor 16 for receiving an inverted signal to the output signal of either high level "H" or low level "L" from the resister 16. The logic gate 17 performs AND operation of the selected one of the first and second detecting signals SD1 and SD2 and the inverted signal. The logic gate 17 outputs an output signal as a result of the AND operation.

The AND gate 18 has first and second input terminals. The first input terminal of the AND gate 18 is also connected to an output terminal of the selector 15 for receiving selected one of the first and second detecting signals SD1 and SD2 from the selector 15. The second input terminal of the AND gate 18 is also connected to the output terminal of the resistor 16 for receiving a non-inverted signal to the output signal of either high level "H" or low level "L" from the resister 16. The AND gate 18 performs AND operation of the selected one of the first and second detecting signals SD1 and SD2 and the non-inverted signal. The AND gate 18 outputs an internal reset signal SR as a result of the above AND operation.

The flag 19 comprises a flip flop circuit of set/reset type. The flag 19 has two input terminals "S" and "R" and a single output terminal "Q". The first input terminal "S" of the flag 19 is connected to the output terminal of the logic gate 17 for receiving the output signal from the logic gate 17. If the first input terminal "S" of the flag 19 receives a high level signal "H" from the logic gate 17, then the flag 19 is set to enter into a high level "H". The second input terminal "R" of the flag 19 is connected to the internal gate bus 20 for receiving the instruction from the CPU core so that the flag 19 is reset to enter into a low level "L". The single output terminal "Q" of the flag 19 is connected to the internal data bus 20 so as to allow the content of the flag 19 to be read out in accordance with a read out instruction which has been transmitted via the internal data bus from the CPU core.

The following descriptions will focus on operations of the above second novel voltage detecting circuit in the second embodiment in accordance with the present invention. Operational modes of the second novel voltage detecting circuit may be classified into first and second modes. In the first mode, the initial power voltage level VDDB is set to be higher than the third reference voltage level Vref3. In the second mode, the initial power voltage level VDDB is set to be lower than the third reference voltage level Vref3.

First Mode

First Initial State

The operation in the first mode of the second novel voltage detecting circuit placed in a first initial state will be described. In the initial state, the data DT3 from the latch circuit 14 are set to be low level "L", and thus the first low voltage detecting circuit 11 is in the inoperable state, whilst the second low voltage detecting circuit 12 is in the operable state. The flag 19 has been reset to be the low level "L" in accordance with the instruction which has been transmitted via the internal data bus 20 from the CPU core. The content stored in the resister 16 is set to be the low level "L".

The initial power voltage level VDDB is set to be higher than the third reference voltage level Vref3, whereby the high voltage detecting circuit 13 detects that the power voltage level is higher than the third reference voltage level Vref3. The high voltage detecting circuit 13 outputs a high level output signal as the third detection signal SD3. Prior to this detection by the high voltage detecting circuit 13, however, the third detection signal SD3 was the high level, for which reason the latch circuit 14 latches the high level as the third detection signal SD3 to continue outputting the high level data as the output data DT3 even the high voltage detecting circuit 13 currently outputs a low level output signal as the third detection signal SD3. The high level data as the output data DT3 is transmitted to the first and second low voltage detecting circuits 11 and 12 and the selector 15. The first low voltage detecting circuit 11 is placed into the operable state, whilst the second low voltage detecting circuit 12 is placed into the operable state. The selector 15 receives the high level data DT3 and thus the selector 15 is placed into such a state as to select the first detecting signal SD1 which has been received from the low voltage detecting circuit 11.

If the power voltage level VDD is further dropped from the initial power voltage level VDDB to a lower voltage level than the third reference voltage level Vref3, then the high voltage detecting circuit 13 detects that the power voltage level VDD is lower than the third reference voltage level Vref3. The high voltage detecting circuit 13 outputs the third detection signal SD3 of the low level "L". Prior to the detection by the high voltage detecting circuit 13, once the data DT3 has been the high level, for which reason the latch circuit 14 continues to latch the high level data DT3 and to send the high level data DT3 to the first and second low voltage detecting circuits 11 and 12 and the selector 15.

If the power voltage level VDD is furthermore dropped to a lower voltage level than the first reference voltage level Vref1, then the first low voltage detecting circuit 11 detects that the power voltage level VDD is lower than the first reference voltage level Vref1. The first low voltage detecting circuit 11 outputs the first detection signal SD1 of the high level "H". The first detection signal SD1 of the high level "H" is then transmitted through the selector 15 and the logic gate 17 to the flag 19 so that the flag 19 is set to be the high level "H". The CPU core sends a read out instruction through the internal data bus 20 to the flag 19, whereby the high level "H" of the flag 19 is red out. Accordingly, the drop of the power voltage VDD down to the first reference voltage level Vref1 can be recognized by the CPU core. The CPU core therefore perform the necessary processing such as reset operations for preventing malfunction of the microcomputer.

Meanwhile, the content stored in the resister 16 has been set to be the low level "L" in the initial state, for which reason the first detection signal SD1 of he high level "H" does not pass through the AND gate 18, whereby the internal reset signal SR remains low level "L".

Second Initial State

The operation in the first mode of the second level voltage detecting circuit placed in a second initial state will be described. In the initial state, the data DT3 from the latch circuit 14 are set to be low level "L", and thus the first low voltage detecting circuit 11 is in the inoperable state, whilst the second low voltage detecting circuit 12 is in the operable state. The flag 19 has been reset to be the low level "L" in accordance with the instruction which has been transmitted via the internal data bus 20 from the CPU core. The content stored in the resister 16 is set to be the high level "H".

The initial power voltage level VDDB is set to be higher than the third reference voltage level Vref3, whereby the high voltage detecting circuit 13 detects that the power voltage level is higher than the third reference voltage level Vref3. The high voltage detecting circuit 13 outputs a high level output signal as the third detection signal SD3. Prior to this detection by the high voltage detecting circuit 13, however, the third detection signal SD3 was the high level, for which reason the latch circuit 14 latches the high level as the third detection signal SD3 to continue outputting the high level data as the output data DT3 even the high voltage detecting circuit 13 currently outputs a low level output signal as the third detection signal SD3. The high level data as the output data DT3 is transmitted to the first and second low voltage detecting circuits 11 and 12 and the selector 15. The first low voltage detecting circuit 11 is placed into the operable state, whilst the second low voltage detecting circuit 12 is placed into the operable state. The selector 15 receives the high level data DT3 and thus the selector 15 is placed into such a state as to select the first detecting signal SD1 which has been received from the low voltage detecting circuit 11.

If the power voltage level VDD is further dropped to a lower voltage level than the first reference voltage level Vref1, then the first low voltage detecting circuit 11 detects that the power voltage level VDD is lower than the first reference voltage level Vref1. The first low voltage detecting circuit 11 outputs the first detection signal SD1 of the high level "H". The first detection signal SD1 of the high level "H" is then transmitted through the AND gate 18 whereby the internal reset signal SR of the high level "H" is outputted from the AND gate 18. The CPU core and other internal circuits in the microcomputer can recognize that the power voltage level VDD is lower than the first reference voltage level Vref1 in accordance with the internal reset signal SR of the high level "H". The CPU core therefore perform the necessary processing such as reset operations for preventing malfunction of the microcomputer.

Meanwhile, the content stored in the resister 16 has been set to be the high level "H" in the initial state, for which reason the first detection signal SD1 of he high level "H" does not pass through the logic gate 17, whereby the flag 19 remains low level "L".

Second Mode

First Initial State

The operation in the first mode of the second novel voltage detecting circuit placed in a first initial state will be described. In the initial state, the data DT3 from the latch circuit 14 are set to be low level "L", and thus the first low voltage detecting circuit 11 is in the operable state, whilst the second low voltage detecting circuit 12 is in the inoperable state. The flag 19 has been reset to be the low level "L" in accordance with the instruction which has been transmitted via the internal data bus 20 from the CPU core. The content stored in the resister 16 is set to be the low level "L".

The initial power voltage level VDDB is set to be lower than the third reference voltage level Vref3, whereby the high voltage detecting circuit 13 detects that the power voltage level is higher than the third reference voltage level Vref3. The high voltage detecting circuit 13 outputs a low level output signal as the third detection signal SD3, for which reason the latch circuit 14 latches the low level as the third detection signal SD3 to continue outputting the low level data as the output data DT3. The low level data as the output data DT3 are transmitted to the first and second low voltage detecting circuits 11 and 12 and the selector 15. The first low voltage detecting circuit 11 remains in the inoperable state, whilst the second low voltage detecting circuit 12 remains in the operable state. The selector 15 receives the low level data DT3 and thus the selector 15 is placed into such a state as to select the second detecting signal SD2 which has been received from the second low voltage detecting circuit 12.

If the power voltage level VDD is further dropped from the initial power voltage level VDDB to a voltage level lower than the first reference voltage level Vref1 and higher than the second reference voltage level Vref2, then the first low voltage detecting circuit 11 remains inoperable state so that the first low voltage detecting circuit 11 does not detect that the power voltage level VDD is lower than the first reference voltage level Vref1. The second low voltage detecting circuit 12 is in operable state, but the second low voltage detecting circuit 12 outputs the low level detecting signal SD2 because the power voltage VDD is higher than the second reference voltage level Vref2.

If the power voltage level VDD is furthermore dropped to a lower voltage level than the second reference voltage level Vref2, then the second low voltage detecting circuit 12 detects that the power voltage level VDD is lower than the second reference voltage level Vref2. The second low voltage detecting circuit 12 outputs the second detection signal SD2 of the high level "H". The second detection signal SD2 of the high level "H" is then transmitted through the selector 15 and the logic gate 17 to the flag 19 so that the flag 19 is set to be the high level "H". The CPU core sends a read out instruction through the internal data bus 20 to the flag 19, whereby the high level "H" of the flag 19 is red out. Accordingly, the drop of the power voltage VDD down to the second reference voltage level Vref2 can be recognized by the CPU core. The CPU core therefore perform the necessary processing such as reset operations for preventing malfunction of the microcomputer.

Meanwhile, the content stored in the resister 16 has been set to be the low level "L" in the initial state, for which reason the second detection signal SD2 of he high level "H" does not pass through the AND gate 18, whereby the internal reset signal SR remains low level "L".

Second Initial State

The operation in the first mode of the second novel voltage detecting circuit placed in a second initial state will be described. In the initial state, the data DT3 from the latch circuit 14 are set to be low level "L", and thus the first low voltage detecting circuit 11 is in the inoperable state, whilst the second low voltage detecting circuit 12 is in the operable state. The flag 19 has been reset to be the low level "L" in accordance with the instruction which has been transmitted via the internal data bus 20 from the CPU core. The content stored in the resister 16 is set to be the high level "H".

The initial power voltage level VDDB is set to be lower than the third reference voltage level Vref3, whereby the high voltage detecting circuit 13 detects that the power voltage level is higher than the third reference voltage level Vref3. The high voltage detecting circuit 13 outputs a low level output signal as the third detection signal SD3, for which reason the latch circuit 14 latches the low level as the third detection signal SD3 to continue outputting the low level data as the output data DT3. The low level data as the output data DT3 are transmitted to the first and second low voltage detecting circuits 11 and 12 and the selector 15. The first low voltage detecting circuit 11 remains in the inoperable state, whilst the second low voltage detecting circuit 12 remains in the operable state. The selector 15 receives the low level data DT3 and thus the selector 15 is placed into such a state as to select the second detecting signal SD2 which has been received from the second low voltage detecting circuit 12.

If the power voltage level VDD is further dropped to a lower voltage level than the second reference voltage level Vref2, then the second low voltage detecting circuit 12 detects that the power voltage level VDD is lower than the second reference voltage level Vref2. The second low voltage detecting circuit 12 outputs the second detection signal SD2 of the high level "H". The second detection signal SD2 of the high level "H" is then transmitted through the AND gate 18 whereby the internal reset signal SR of the high level "H" is outputted from the AND gate 18. The CPU core and other internal circuits in the microcomputer can recognize that the power voltage level VDD is lower than the second reference voltage level Vref2 in accordance with the internal reset signal SR of the high level "H". The CPU core therefore performs the necessary processing such as reset operations for preventing malfunction of the microcomputer.

Meanwhile, the content stored in the resister 16 has been set to be the high level "H" in the initial state, for which reason the first detection signal SD1 of the high level "H" does not pass through the logic gate 17, whereby the flag 19 remains low level "L".

The initial power voltage level VDDB is set higher or lower than the third reference voltage level Vref3, so that the first and second low voltage detecting circuits 11 and 12 are set to be operable/inoperable states or inoperable/operable states. In addition to the effect of the first embodiment, even if the initial power voltage VDDB is set lower than the third reference voltage Vref3, then it is possible to detect that the power voltage VDD is dropped into a lower voltage level than the second refence voltage Vref2. The CPU core and the other circuits of the microcomputer can recognize the drop of the power voltage level. Independently from the contents stored in the resister 16, the flag 19 is kept reset in the low level "L" whilst the internal reset signal SR is also kept to be low level "L". The CPU core and the other internal circuits in the microcomputer does not recognizes the drop of the power voltage, whereby no reset operation is executed to allow the other circuits in the microcomputer to continue the normal operations.

As a modification to the above embodiments, it is possible to provide three or more low voltage detecting circuits or also possible to provide two or more high voltage detecting circuits so that it is possible to make circuits common other than the power circuit and make the program common. It is further possible that the high voltage detecting circuit detects that an excess high voltage is applied to the high voltage detecting circuit for preventing the break down of the circuit to improve the safety.

In the above embodiments, the output signal from the logic gate is used as the internal reset signal. It is, however, possible to use the output signal as an interrupt request signal for interrupting operations by the CPU core.

The above first and second novel voltage detecting circuit may be applicable to not only the single chip microcomputer but also other electronic devices such as semiconductor memories, for example, RAM and ROM as other electronic circuits such as digital signal processors so that the circuit configuration other than the power circuit and the program are made common.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A voltage detecting circuit comprising:
    a low voltage detecting circuit for detecting that a power voltage is lower than a predetermined reference voltage;
    a high voltage detecting circuit for detecting that the power voltage is higher than the predetermined reference voltage; and
    a controller being connected to the low voltage detecting circuit and the high voltage detecting circuit so that the controller receives an output signal from the high voltage detecting circuit in order to place the low voltage detecting circuit into selected one of operable and inoperable states in accordance with the output signal from the high voltage detecting circuit.

2. The voltage detecting circuit as claimed in claim 1, the predetermined reference voltage is a first predetermined reference voltage wherein the high voltage detecting circuit also detects that the power voltage is lower than a second predetermined reference voltage, the second predetermined reference voltage being higher than the first predetermined reference voltage.

3. The voltage detecting circuit as claimed in claim 1, further comprising a logic circuit connected to the low voltage detecting circuit for receiving a low voltage detecting signal from the low voltage detecting circuit to generate a reset signal in accordance with the low voltage detecting signal.

4. The voltage detecting circuit as claimed in claim 1, further comprising a logic circuit connected to the low voltage detecting circuit for receiving a low voltage detecting signal from the low voltage detecting circuit to generate an interrupting request signal in accordance with the low voltage detecting signal.

5. The voltage detecting circuit as claimed in claim 1, further comprising a flag connected to the low voltage detecting circuit for receiving a low voltage detecting signal from the low voltage detecting circuit to set the flag in accordance with the low voltage detecting signal.

6. The voltage detecting circuit as claimed in claim 1, further comprising:
- a logic circuit connected to the low voltage detecting circuit for receiving a low voltage detecting signal from the low voltage detecting circuit to generate a reset signal in accordance with the low voltage detecting signal;
- a flag connected to the low voltage detecting circuit for receiving a low voltage detecting signal from the low voltage detecting circuit to set the flag in accordance with the low voltage detecting signal,
- wherein any one use of the logic circuit and the flag is selectable by an instruction from CPU.

7. The voltage detecting circuit as claimed in claim 1, further comprising:
- a logic circuit connected to the low voltage detecting circuit for receiving a low voltage detecting signal from the low voltage detecting circuit to generate an interrupting request signal in accordance with the low voltage detecting signal;
- a flag connected to the low voltage detecting circuit for receiving a low voltage detecting signal from the low voltage detecting circuit to set the flag in accordance with the low voltage detecting signal,
- wherein any one use of the logic circuit and the flag is selectable by an instruction from CPU.

\* \* \* \* \*